(12) United States Patent
Lercel et al.

(10) Patent No.: US 6,806,006 B2
(45) Date of Patent: Oct. 19, 2004

(54) INTEGRATED COOLING SUBSTRATE FOR EXTREME ULTRAVIOLET RETICLE

(75) Inventors: Michael J. Lercel, Fishkill, NY (US); Dhirendra Prasad Mathur, Monroe, CT (US)

(73) Assignees: International Business Machines Corporation, Armonk, NY (US); Photronics, Inc., Jupiter, FL (US)

( * ) Notice: Subject to any disclaimer, the term of this patent is extended or adjusted under 35 U.S.C. 154(b) by 184 days.

(21) Appl. No.: 10/064,441

(22) Filed: Jul. 15, 2002

(65) Prior Publication Data

US 2004/0009410 A1 Jan. 15, 2004

(51) Int. Cl.[7] ............................. G03F 9/00; G21K 5/00
(52) U.S. Cl. ............................................. 430/5; 378/35
(58) Field of Search ................. 430/5; 62/3.2; 378/35

(56) References Cited

U.S. PATENT DOCUMENTS

| | | | |
|---|---|---|---|
| 4,621,042 A | 11/1986 | Pampalone et al. | 430/271 |
| 5,712,448 A | 1/1998 | Vandersande et al. | 136/203 |
| 5,870,823 A | 2/1999 | Bezama et al. | 29/848 |
| 6,098,408 A | 8/2000 | Levinson et al. | 62/3.2 |
| 6,101,715 A | 8/2000 | Fuesser et al. | 29/890.03 |
| 6,219,237 B1 | 4/2001 | Geusic et al. | 361/699 |
| 6,496,370 B2 * | 12/2002 | Geusic et al. | 361/699 |
| 6,686,532 B1 * | 2/2004 | Macris | 136/204 |

* cited by examiner

Primary Examiner—S. Rosasco
(74) Attorney, Agent, or Firm—McGinn & Gibb, PLLC; Richard M. Kotulak, Esq.

(57) ABSTRACT

The current invention provides a method and apparatus that minimizes the destructive effects of non-reflected energy during lithography. More specifically, a cooling system is located within the mask. In one example, a cooling module is integrated into the EUV mask. The cooling module may be thermoelectric. The EUV mask comprises a substrate structure as a base for a reticle, a cooling layer, which is formed on the substrate structure and a planarizing layer deposited on the cooling layer. In another example, a cooling channel is formed within the mask.

20 Claims, 4 Drawing Sheets

| MATERIAL | COEFFICIENT OF THERMAL EXPANSION (PARTS PER MILLION PER DEGREE CELSIUS) | THERMAL CONDUCTIVITY (W/m K) |
|---|---|---|
| Pyrex | 3.25 | 2 |
| Borosilicate Glass (Low Expansion) | 3.25 | 1.1 |
| Silicon | 2.6 | 156 |
| Diamond | 2.7 | 1000 |
| SiC (Sintered) | 4.4 | 150 |

FIG.6

INTEGRATED COOLING SUBSTRATE FOR EXTREME ULTRAVIOLET RETICLE

STATEMENT AS TO FEDERALLY SPONSORED RESEARCH

This invention was made with U.S. Government support under Agreement No. N00019-99-3-1366 awarded by the Naval Air Systems Command. The U.S. Government has certain rights in the invention.

BACKGROUND OF THE INVENTION

1. Field of the Invention

The present invention relates to minimizing the destructive effects of non-reflected energy during lithography and, more particularly, to including a cooling system within a mask blank.

2. Description of the Related Art

In semiconductor lithography, and more specifically, extreme ultraviolet lithography (hereinafter "EUVL"), the desired pattern is imaged on top of a reflective substrate through an absorber layer by a mask or reticle. The reflective layer, however, has about a 70% reflectivity. Thus, the remaining non reflected energy, about 30%, is absorbed in the reflective substrate. Accordingly, during exposure, a large amount of heat is absorbed in the reticle substrate. The non-reflected energy in the reticle results in the reticle being heated, which causes the reticle to distort. Since the reticle illumination is non-telecentric, the distortion leads to large image placement variations on the wafer.

To overcome these distortions and variations, careful control of the reticle flatness and temperature, during the lithography, is required. Traditionally, a substrate material with a very low coefficient of thermal expansion and with a low flatness value is utilized, which results in minimizing the adverse effect of the non-reflected energy. However, materials that meet these standards are difficult to manufacturer and/or expensive. For example, the proposed SEMI specifications, SEMI standard 3148, as applied to EUVL is 5 ppb/C (for production class substrates) in combination with flatness requirements is extremely expensive to accomplish.

SUMMARY OF THE INVENTION

In order to attain the objects suggested above, there is provided, according to one aspect of the invention, an extreme ultraviolet (hereinafter "EUV") mask comprising a cooling layer, wherein the cooling layer minimizes the distortion effects of nonreflected energy during lithography In another embodiment of the present invention, there is provided a EUV mask wherein the mask comprises a substrate structure as a base for a reticle, a cooling layer, which is formed on the substrate structure; and a planarizing layer deposited on the cooling layer.

In another embodiment of the present invention, there is provided an EUV mask wherein the mask is cooled by a thermoelectric module.

BRIEF DESCRIPTION OF THE DRAWINGS

The foregoing and other objects, aspects and advantages will be better understood from the following detailed description of preferred embodiments of the invention with reference to the drawings, in which:

FIG. 6 is a chart of mask blank materials.

DETAILED DESCRIPTION OF PREFERRED EMBODIMENTS OF THE INVENTION

In semiconductor lithography, and more specifically, extreme ultraviolet lithography (hereinafter "EUVL"), the desired pattern is imaged on top of a reflective substrate through an absorber layer by a mask or reticle. The reflective layer, however, has about a 70% reflectivity. Thus, the remaining non reflected energy, about 30%, is absorbed in the reflective substrate. Accordingly, during exposure, a large amount of heat is absorbed in the reticle substrate. Because the illumination of the reticle is non-telecentric (i.e., not at normal to the reticle surface), the amount of non-reflected energy distorts in the reticle, which leads to large variations in image placement of the printed patterns on the wafer.

The present invention integrates a cooling element with the mask, i.e., the substrate incorporates layers for a Peltier effect (thermoelectric) cooling system, thereby reducing the effects of thermal expansion.

Specifically, the mask substrate is cooled during use in the lithography system by application of a current that cools the dissimilar layers as electrons pass from one material to another, i.e., thermoelectric cooling. In an alternative embodiment of the present invention, the thermoelectric cooling may by optimized by varying the characteristics of the material, such as, but not limited to, utilizing n and p doped materials or by using dissimilar metals.

Figure 1:
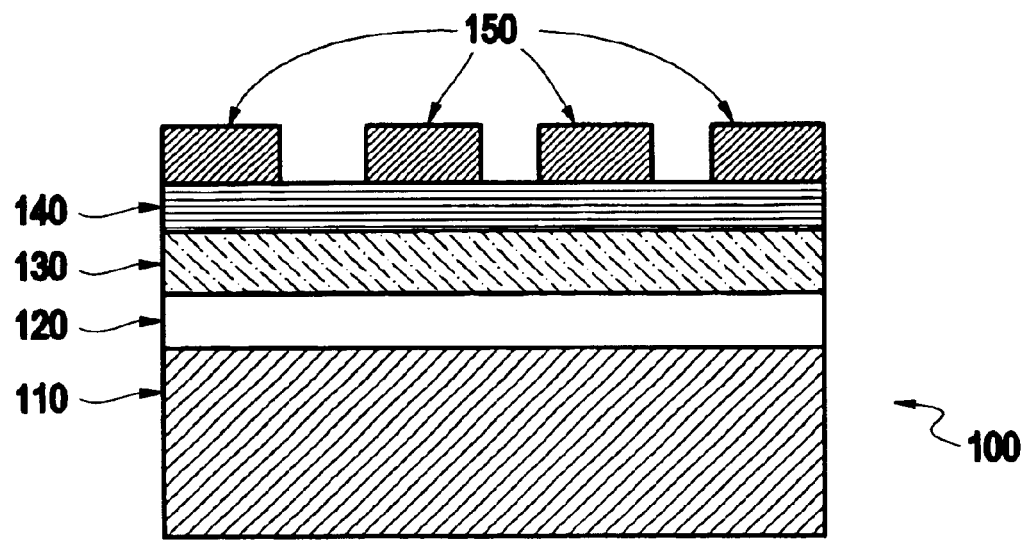
FIG. 1 is an illustration of a side view of a mask blank with a cooling module.

FIG. 1 illustrates a side view of a mask blank 100. The mask blank 100 comprises a mask substrate material (e.g., reticle) 110, an active cooling layer 120, a mask surface and/or planarizing layer 130, a multilayer reflector 140, and an absorber stack 150. The mask is referred to as a mask "blank" at different points of this disclosure to indicate that light absorbing, light blocking, light reflecting, etc. structures (not shown) would be formed over the inventive structure to complete the mask. The active cooling layer 120 is formed on the mask substrate material 110. The planarizing layer 130 is deposited on the cooling layers 120. The EUV multilayer reflector layer 140 is deposited on the planarizing layer 130 and the absorber stack 150 is then deposited on the planarizing layer 140. The absorber stack may comprise multiple materials as well as multiple layers. For example, absorber stack 150 may comprise an absorber layer plus a buffer.

The substrate material 110 does not necessarily need to have a low coefficient of thermal expansion, i.e., since it will be cooled. The cooling layer 120 comprises material that provides for thermoelectric cooling. The planarizing level 130 is polished to the required flatness of the EUVL mask substrate, i.e., for example, 50 nm across the critical site area.

In addition, the substrate material 110 can be chosen based on the amount of thermal conductivity required. For example, optimal thermal conductivity is achieved by using materials such as, but not limited to, silicon, diamond, or SiC. In an alternative embodiment of the present invention, the mask substrate layers may be optimized for thermal conductivity instead of just thermal expansion.

Figure 2:
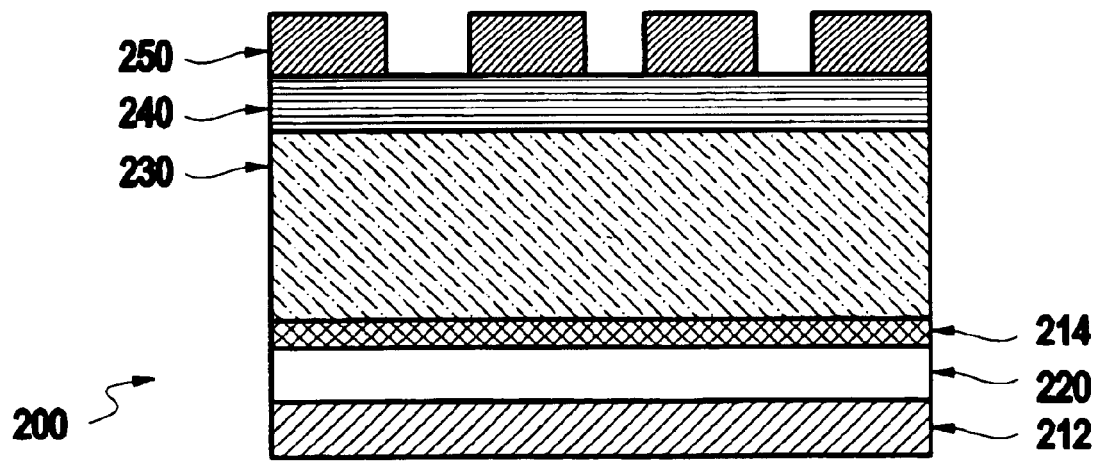
FIG. 2 is an illustration of a side view of a thermoelectric cooler integrated into the EUVL lithography system reticle chuck.

FIG. 2, another alternative embodiment of the present invention, illustrates a side view of a thermoelectric cooler integrated into the EUVL lithography system reticle chuck, as opposed to being embedded directly in the mask substrate. The mask blank 200 comprises a chuck base material 212, chuck surface film 214, an active cooling layer 220, a mask surface and/or planarizing layer 230, a multilayer reflector 240, and an absorber stack 250. The active cooling layer 220 is formed as part of the chuck. In FIG. 2, the active cooling layer is formed on top of the chuck base material 212 and below the chuck surface film 214. The planarizing layer 130 is deposited on the chuck surface film 214. The EUV multilayer reflector layer 240 is deposited on the planarizing layer 230 and the absorber stack 250 is then deposited on the planarizing layer 240. The absorber stack may comprise multiple materials as well as multiple layers. For example, absorber stack 250 may comprise an absorber layer plus a buffer.

Figure 3:
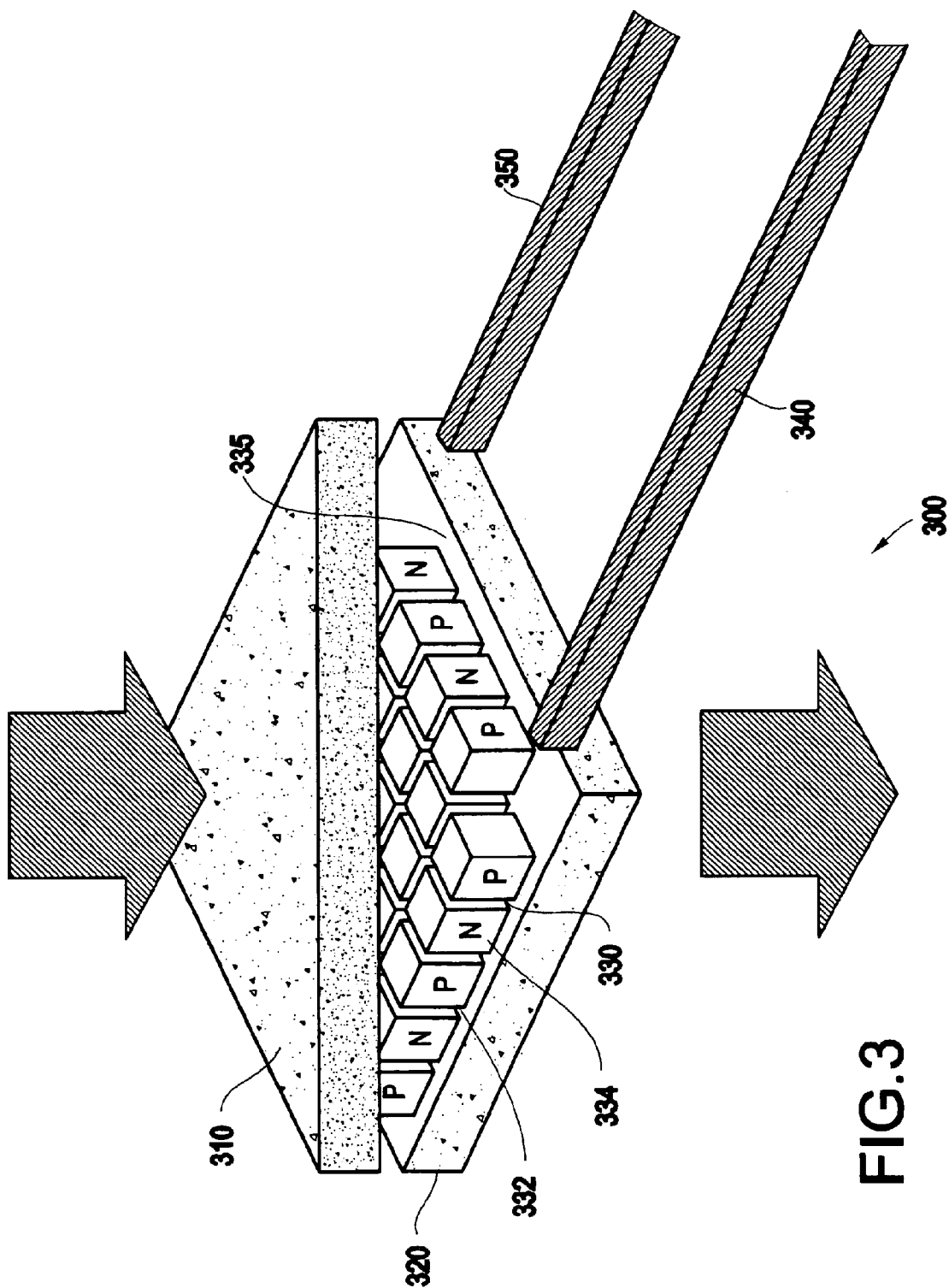
FIG. 3 is an illustration of a thermoelectric module.

FIG. 3 illustrates a thermoelectric module 300 that includes a first ceramic substrate 310, a second ceramic substrate 320, and multiple semiconductor pellets 330. The semiconductor pellets 330 comprise n-type pellets 332 and p-type pellets 334. The n-type pellets and the p-type pellets are electrically connected to each other via small conductive tabs 335 and to a corresponding negative electrical conductor 340 and a positive electrical conductor 350. The semiconductor pellets 330 are located between the first ceramic substrate 310 and the second ceramic substrate 320. The semiconductor pellets can be any material so long as the total heat flux is relatively small. Examples of semiconductor pellets 330 include, but are not limited to, BiTe, PbTe, SiGe, BiSb, as well as Silicon. The ceramic substrates 310 and 320 may comprise, but are not limited to, metalized materials.

The semiconductor pellets 330 are doped so that one type of charge (i.e., either positive or negative) carries the majority of current. Pairs of p-type and n-type pellets 330 are configured so that they are connected electrically in series, but thermally in parallel. The ceramic substrates 310 and 320 provide the platform for the semiconductor pellets 330 and small conductive tabs 335, that connect them. The semiconductor pellets 330, the tabs 335, and substrates 310 and 320 thus form a layered configuration. Thermoelectric modules can function singularly or in groups with either series, parallel, or series/parallel electrical connections. In an alternative embodiment, applications use stacked multistage modules.

When DC voltage is applied to the thermoelectric module 300, the positive and negative charge carriers in the pellet array absorb heat energy from one substrate surface and release it to the substrate at the opposite side. The surface where heat energy is absorbed becomes cold; the opposite surface where heat energy is released, becomes hot.

In an alternative embodiment of the present invention, the thermoelectric module 300 can be used to convert heat energy to electricity. When a temperature gradient is created across thermoelectric module 300, a DC voltage develops across the negative and positive terminals 340 and 350. When a load is properly connected, electrical current flows.

In an alternative embodiment of the present invention, cooling is accomplished using a channel of cooling liquid. A mask blank integrates cooling channels internal to the mask blank itself. In addition, high thermal conductivity materials such as, but not limited to, diamonds and/or silicon are utilized to maximize the heat transfer to the cooling fluid.

This embodiment of the present invention fabricates mask blanks with cooling channels by etching narrow cooling channels into the surface of the mask blank material in a pattern to allow a cooling liquid to flow through the mask blank. A top layer is bonded to the etched mask blank and the surface is then polished to the required flatness (approximately 50 nm across the critical area) and smoothness (less than 1 nm rms) of an EUVL mask blank. The mask blank material is typically a low expansion glass such as ULE (Trademark of Corning) or Zerodur (Trademark of Schott). In an alternative embodiment of the present invention, materials with a higher thermal conductivity can also be used since the present invention allows for a greater flexibility on the coefficient of thermal expansion. Thus, for examples, materials comprising, such as, but not limited to, diamond, diamond like carbon, silicon, SiC, BN, etc., can be used.

In one embodiment of the present invention, the cooling liquid which flows through the mask blank is water. In an alternative embodiment of the present invention, any liquid which is able to cool the mask blank is a potential cooling fluid. Examples of other cooling liquids include, but are not limited to, freon based coolants, fluorocarbon oils, ethylene glycol, etc.

Figure 4:
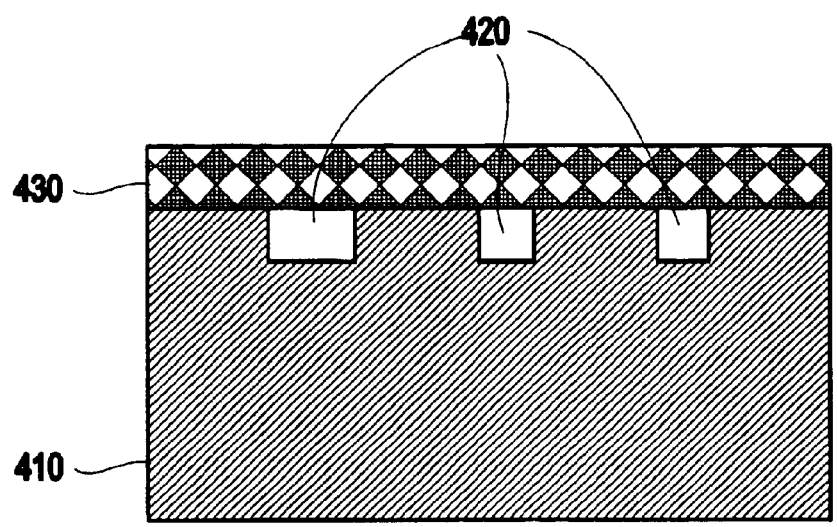
FIG. 4 is an illustration of a mask blank with cooling channels.
Figure 5:
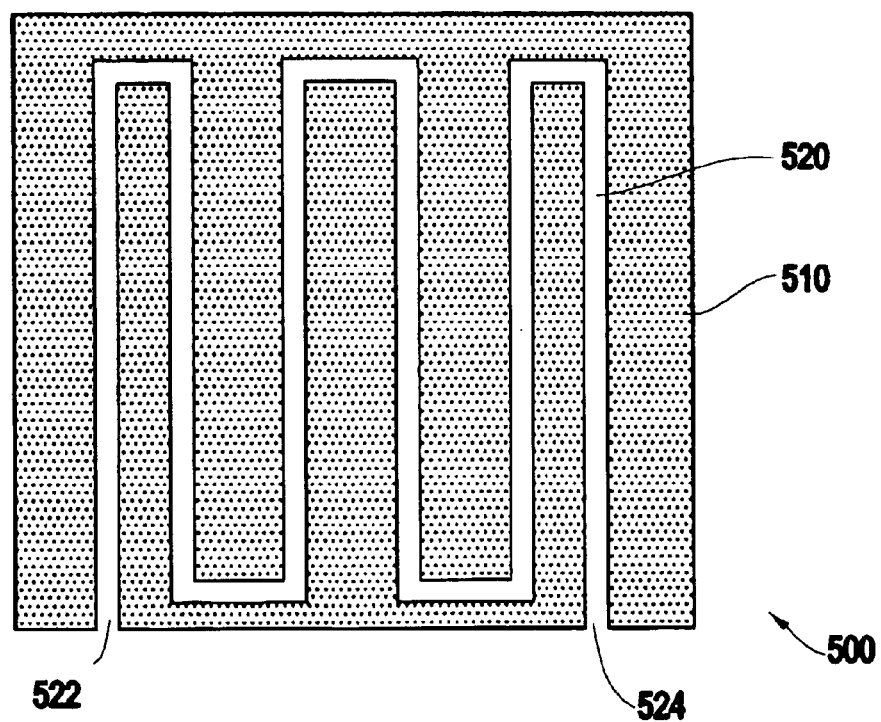
FIG. 5 is an illustration of a cooling channel pattern.

FIG. 4 illustrates a front view of a channel cooling mask blank 400. Mask blank 400 comprises a substrate 410, which is typically a form of low expansion ceramic such as, but not limited to, Ti-doped quartz, that is patterned with a desired pattern. FIG. 5 illustrates a top view of a pattern that can be integrated with mask blank 400 of FIG. 4. FIG. 5 shows a channel (or groove) 520 within substrate 510 beginning at a first opening 522 and ending at a second opening 524.

Channels 420 of FIG. 4 are etched into the substrate 410 via common MEMS (micro electro mechanical system) fabricating, such as, but not limited to, reactive ion etching with a resist mask. The channels 420 can be any size from very small across (less than 1 micron) with very high density to very large cross-section (approximately 1 mm) with low density. The channels are then covered with a cover layer 430. Cover layer 430 can be the same material as the substrate 410. Cover layer 430 is bonded to substrate 410 through common processes such as, but not limited to, anodic bonding, adhesive bonding, or thermal interdiffusion. In an alternative embodiment of the present invention, cover layer 430 can be a different material than substrate 410.

In another embodiment of the present invention, substrate 410 comprises a machinable material and channels 420 are formed by direct machining of the substrate. In another alternative embodiment of the present invention, channel 420 are formed by sintering or injection molding techniques.

In a preferred embodiment of the present invention, substrate 410 of FIG. 4 may comprise any of the materials listed in FIG. 6. Included in FIG. 6 is a list of substrate materials with respective thermal expansion and thermal conductivity values. Since the present invention provides a smaller temperature range for the substrate, via active cooling, more robust materials may be used than those materials used if there was no active cooling. For example, substrate materials with a coefficient of thermal expansion in the range of parts per million per degree Celsius are now possible. In contrast, the coefficient of thermal expansion for substrate materials, when there is no active cooling, are in the range of parts per billion per degree Celsius.

While the invention has been described in terms of preferred embodiments, those skilled in the art will recognize that the invention can be practiced with modification within the spirit and scope of the appended claims.

What is claimed is:

1. A mask, wherein said mask comprises:

a substrate;

a cooling layer on said substrate;

a planarizing layer on said cooling layer; and a mask absorber above said planarizing layer, wherein said substrate, said cooling layer, said planarizing layer, and said mask absorber comprise an integrated structure.

2. The mask of claim 1, wherein said substrate structure material comprises a coefficient of thermal expansion less than 1 parts per billion per degree Celsius.

3. The mask of claim 1, wherein said substrate structure material comprises a coefficient of thermal expansion between the range of 1 parts per million per degree Celsius and 5 parts per billion per degree Celsius.

4. The mask of claim 1, wherein said mask comprises an extreme ultraviolet mask.

5. The mask of claim 4, wherein said semiconductor pellets comprise p-type pellets and n-type pellets.

6. The mask of claim 1, wherein said cooling layer comprises a thermoelectric module.

7. The mask of claim 1, wherein said cooling layer comprises semiconductor pellets.

8. The mask of claim 1, wherein said cooling layer comprises a thermoelectric cooler.

9. The mask of claim 1, wherein said planarizing layer has height variations not exceeding 50 nm.

10. The mask of claim 1, where said planarizing layer supports an extreme ultraviolet multilayer reflector.

11. The mask of claim 1, where said planarizing layer supports said mask absorber.

12. A mask blank comprising:

a substrate having at least one cooling channel;

a cooling fluid within said cooling channel; and a mask absorber above said substrate, wherein said substrate, said cooling channel, and said mask absorber comprise an integrated structure.

13. The mask blank of claim 12, wherein said cooling fluid comprises water.

14. The mask blank of claim 12, wherein said substrate comprises a low expansion ceramic.

15. The mask blank of claim 12, wherein said cooling channel has a cross section diameter of less than approximately 1 micron.

16. The mask blank of claim 12, wherein said cooling channel has a cross section diameter of up to approximately 1 mm.

17. The mask blank of claim 12, further comprising a cover material covering said cooling channel.

18. A method of making a mask blank, said method comprising:

forming at least one cooling channel in a mask substrate;

enclosing said channels with a cover material; and forming a mask absorber above said mask substrate layer, wherein said forming of said substrate, said cooling channel, and said mask absorber forms an integrated structure.

19. The method of claim 18, wherein said forming of said cooling channel comprises direct machining of said mask substrate.

20. The method of claim 18, wherein said forming of said cooling channel comprises sintering said mask substrate.

* * * * *